United States Patent [19]

Bremenour et al.

[11] 4,152,750
[45] May 1, 1979

[54] I/O INTERFACE RACK FOR SOLID STATE CONTROL SYSTEM

[75] Inventors: Edwin L. Bremenour, Euclid; Odo J. Struger, Chagrin Falls, both of Ohio

[73] Assignee: Allen-Bradley Company, Milwaukee, Wis.

[21] Appl. No.: 900,427

[22] Filed: Apr. 27, 1978

Related U.S. Application Data

[63] Continuation of Ser. No. 790,769, Apr. 25, 1977, abandoned.

[51] Int. Cl.$^2$ ............................................. H02B 1/04
[52] U.S. Cl. .................................. 361/383; 361/393; 361/415
[58] Field of Search ............ 339/17 LM, 17 M, 17 N, 339/198 R, 198 G, 198 GR; 361/331, 383, 393, 394, 412–415, 426, 429, 334

[56] References Cited

U.S. PATENT DOCUMENTS

| 3,236,975 | 2/1966 | De Smidt | 337/187 |
| 3,271,626 | 9/1966 | Howrilka | 361/415 |
| 3,478,251 | 11/1969 | Perotto | 361/415 |
| 3,601,661 | 8/1971 | Kleinhample, Jr. | 361/415 |

Primary Examiner—Gerald P. Tolin
Attorney, Agent, or Firm—Quarles & Brady

[57] ABSTRACT

A pair of spaced side plates are connected together by mounting bars which support a circuit board. Individual I/O modules plug into connectors on the circuit board and are fastened to the mounting bars. Wiring from the controller processor is brought into an adapter module which also plugs into the circuit board and external wiring is brought into terminal blocks which mount along the top and bottom edges of the circuit board. The wire terminals on the terminal blocks are connected to the conductive paths on the circuit board to provide electrical connection with the circuits in the I/O modules.

13 Claims, 8 Drawing Figures

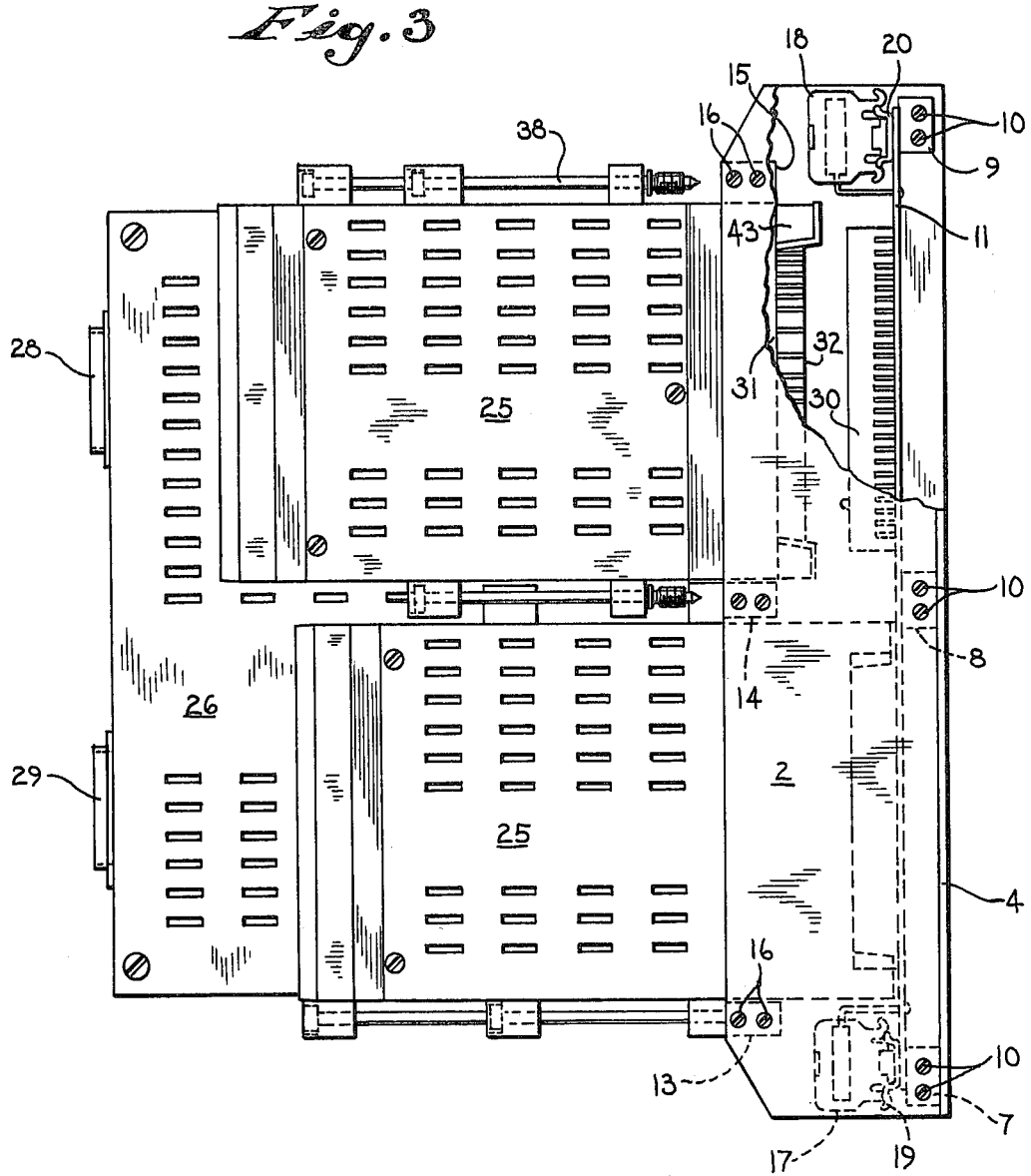

I/O INTERFACE RACK FOR SOLID STATE CONTROL SYSTEM

This is a continuation of application Ser. No. 790,769, filed Apr. 25, 1977, now abandoned.

BACKGROUND OF THE INVENTION

The field of the invention is input/output interface racks for control systems such as programmable controllers, process controls and numerical controls, and particularly, means for mounting a number of input and output interface circuits for such a control system and connecting them to the machine being controlled.

In electrical control systems such as solid state controllers, numerical controls, programmable controllers and process controls, the circuits which interface the system to the machine being controlled are typically mounted on printed circuit boards which are arranged alongside one another and are interconnected by a wiring harness or a "mother board". The electrical connection of such interface circuits to the machine being controlled is made by the user and it may involve the connection of hundreds or even thousands of wires to terminals on the interface circuit boards.

In I/O interface racks such as those disclosed in U.S. Pat. Nos. 3,992,654 and 3,942,077, the wire terminals on each interface circuit board are disposed along its front edge where they are readily accessible to maintenance personnel. In most applications there wire terminals are not connected directly to the controlled machine, but instead, are connected thereto through a terminal block which is mounted within the same enclosure as the I/O interface rack. Terminal blocks such as that disclosed in U.S. Pat. No. 3,236,975 are often employed for this purpose because they are suitable for use in industrial environments. Such terminal blocks are rugged and have been employed for years in industry when "field wiring" is necessary. In prior I/O interface racks it becomes necessary to hand wire the terminals on the interface circuit boards to the heavy duty wire terminals in addition to hand wiring those terminals to the devices on the controlled machine. This additional hand wiring adds considerably to the overall cost of the control system.

SUMMARY OF THE INVENTION

The present invention relates to an I/O interface rack for a control system, and particularly, to one which supports a mother board between a pair of spaced side plates and which mounts a terminal block along one edge of the mother board which is electrically connected to the conductive path network on the mother board. A plurality of I/O interface circuits disposed on printed circuit boards plug into connectors on the mother board and are firmly mounted thereto between the side plates. All field wiring is done directly on the terminal block which electrically connects to the I/O interface circuits through the mother board and associated connectors.

A general object of the invention is to provide a compact and rugged I/O interface rack which allows field wiring directly to the interface circuit terminals. Rather than providing wire terminals along the front edge of each interface circuit printed circuit board, electrical connections are made through the connector to the mother board and directly to the terminal block. These connections are provided in the printed circuitry and no hand wiring is required.

Another general object of the invention is to provide an interface rack in which I/O modules may be removed or replaced without disconnecting or reconnecting wires. All wiring is connected to the terminal blocks and coupled through the mother board and connectors to the appropriate I/O module. These connections are broken merely by pulling the module free of its connector.

Another object of the invention is to facilitate the removal and replacement of I/O modules. Only two mounting screws need be loosened to unfasten each module. These mounting screws are retained to the module case and, therefore, when the module is pulled free, there are no parts which can fall and become lost.

Yet another object of the invention is to provide adequate cooling for a plurality of I/O modules which are mounted close together one alongside the other.

The foregoing and other objects and advantages of the invention will appear from the following description. In the description reference is made to the accompanying drawings which form a part hereof, and in which there is shown by way of illustration a preferred embodiment of the invention. Such embodiment does not necessarily represent the full scope of the invention, however, and reference is therefore made to the claims herein for interpreting the scope of the invention.

BRIEF DESCRIPTION OF THE DRAWINGS

FIG. 3 is a side elevation view of the invention with parts cut away and selected modules partially removed, FIG. 4 is a partial perspective view of the terminal block which forms part of the invention of FIGS. 1-3, FIGS. 5a-c are left side, right side and top elevation views of a module which forms part of the invention of FIGS. 1-3.

DESCRIPTION OF THE PREFERRED EMBODIMENT

Figure 1:
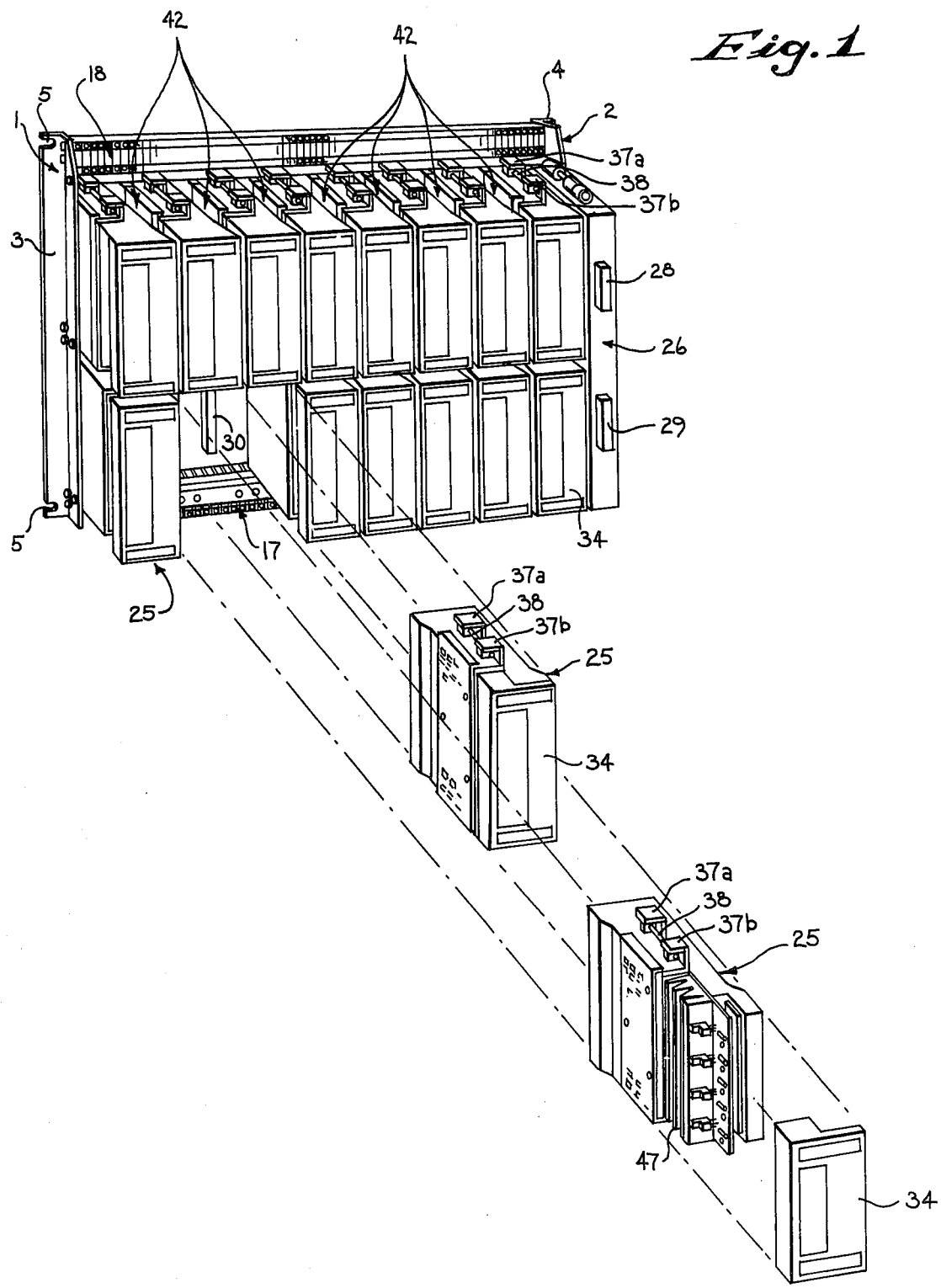
FIG. 1 is a perspective view of the invention with two modules removed.
Figure 2:
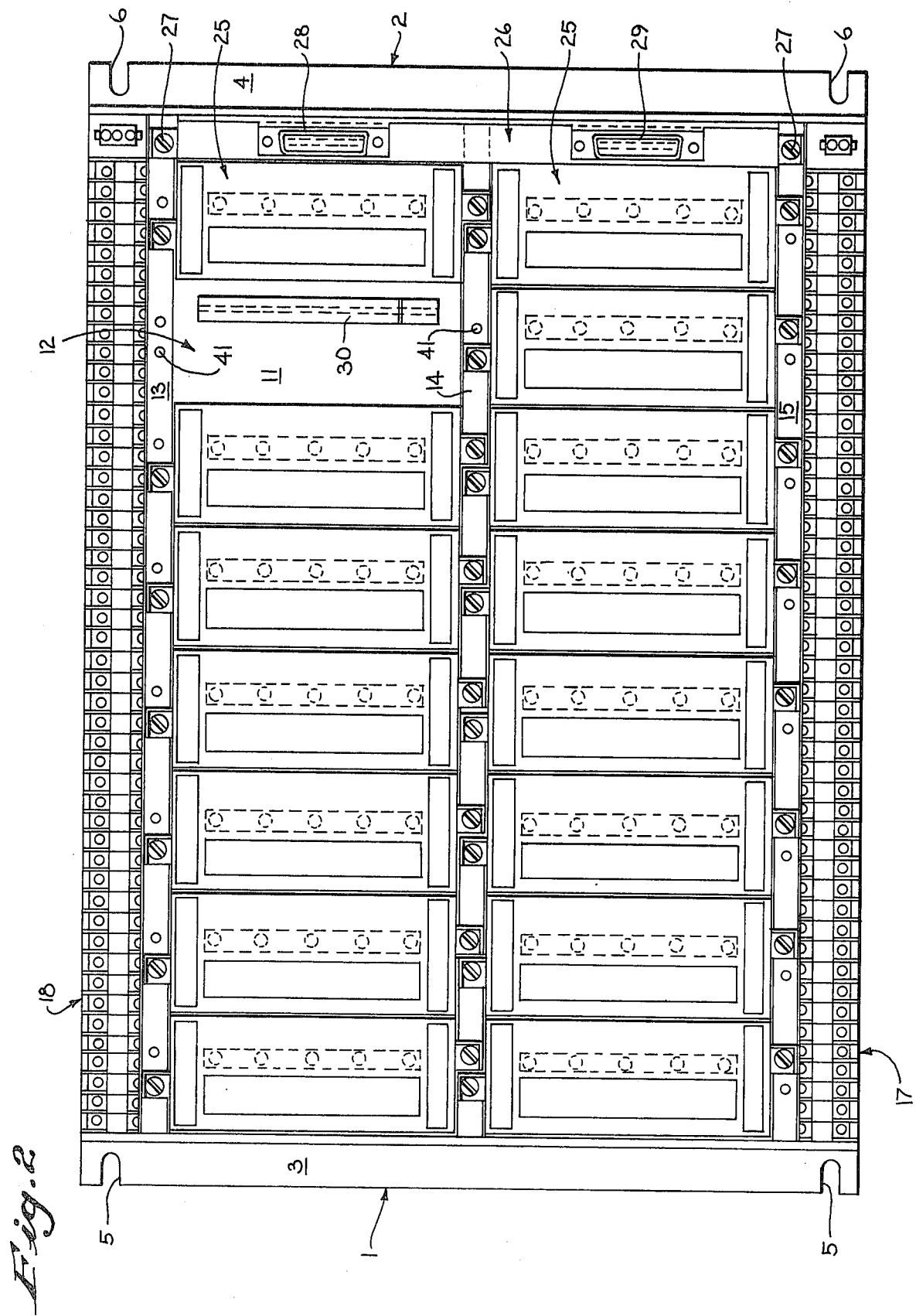
FIG. 2 is a front elevation view of the invention with one module removed.
Figure 5A:
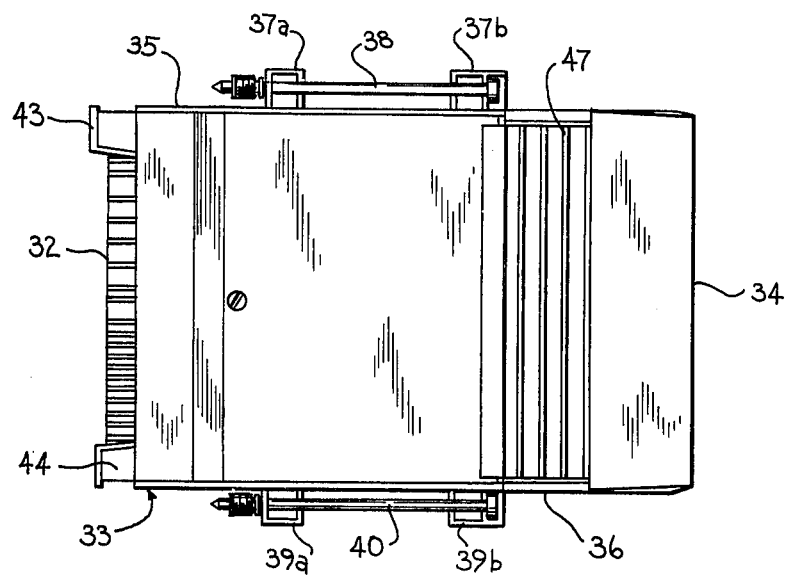
Figure 5B:
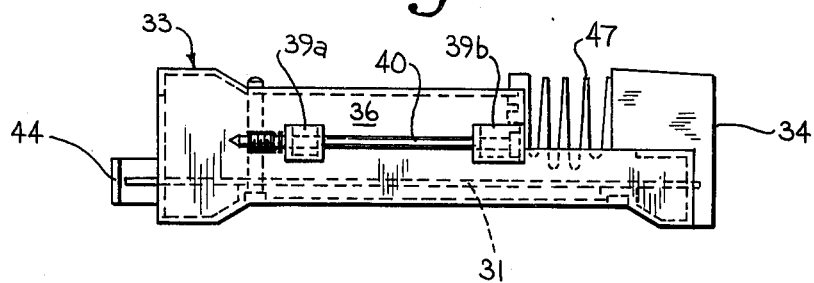
Figure 5C:
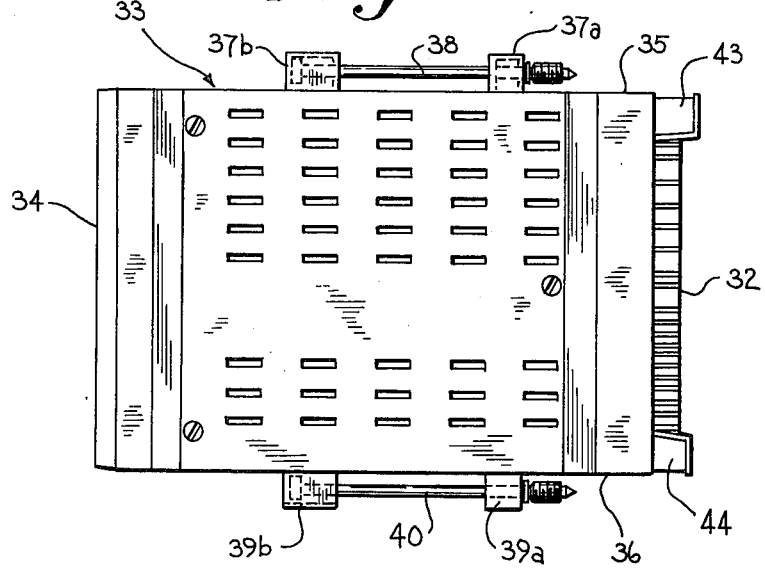

Referring particularly to FIGS. 1-3, the I/O interface rack includes a pair of spaced metal side plates 1 and 2 which have integral mounting ears 3 and 4 that extend outward along their entire back edge. The ears 3 and 4 each include a pair of slots 5 and 6 which face outward and are suitable for receiving mounting bolts (not shown in the drawings). Typically, the I/O interface rack is mounted to the backwall of an enclosed cabinet (not shown in the drawings) which also houses other I/O interface racks and a programmable controller processor such as that disclosed in copending U.S. patent application Ser. No. 790,251 entitled "Programmable Controller with Integral Micro-Processor".

As shown best in FIGS. 2 and 3, three circuit board mounting bars 7-9 extend between the side plates 1 and 2 and are fastened thereto by screws 10. The mounting bars 7-9 are equally spaced and are disposed in a common back plane. A rectangular shaped mother board, or circuit board 11 is fastened to the mounting bars 7-9 and is disposed in the back plane defined by them. The circuit board 11 includes a network of conductive paths on both its surfaces which are formed from etched metal foil. The circuit board 11 extends between the upright side plates 1 and 2, and together they define a shallow cavity indicated generally at 12.

As shown best in FIGS. 2 and 3, three module mounting bars 13–15 also extend between the side plates 1 and 2 and are fastened thereto by screws 16. These mounting bars 13–15 are attached along the forward edge of the side plates 1 and 2 and they are, therefore, in a common plane which is substantially forward of the circuit board 11. The mounting bars 13–15 serve not only to strengthen the framework which supports the circuit board 11 and to thus minimize the twisting forces thereon, but also, to guide and secure the individual I/O modules as will be described hereinafter.

Mounted along opposing edges of the circuit board 11 and disposed on its front surface are terminal blocks 17 and 18. As shown best in FIG. 4, the terminal blocks 17 and 18 are similar to those disclosed in U.S. Pat. No. 3,236,975 in which each is releasably retained to metal mounting channels 19 and 20. The terminal blocks 17 and 18 are commercially available in segments of various sizes and these segments can be selectively positioned on the mounting channel 19 or 20 and snapped into place. The mounting channels 19 and 20 are securely fastened by bolts (not shown) which extend through the circuit board 11 and into threaded engagement with the board mounting bars 7 and 9 which lie directly therebeneath. They extend the entire length of the circuit board 11 from one side plate to the other.

Referring particularly to FIG. 4, the terminal blocks 17 and 18 include a molded plastic frame 21 which includes a plurality of spaced upright barrier walls 22 that define terminal compartments therebetween. Each compartment includes a wire terminal comprised of a metallic cage 23 into which a wire 45 may be inserted and fastened by means of a screw 24. A tongue portion 43 is formed on a metallic connector 44 and it extends into the cage 23 and makes electrical connection with the wire 45. The connector 44 also has an integrally formed arm 46 which extends outward to the opposite side of the frame 21. The arm 46 is bent downward at a right angle and its end extends through an opening in the mother board 11 and is soldered in place to the conductive network thereon.

All positions on the mounting channels 19 and 20 are occupied in the illustrated preferred embodiment, however, it can be appreciated that some of the terminal block segments may not be needed in certain installations which do not require as many wire termination points. In addition to the flexibility in the number and position of the terminal block segments afforded by this arrangement, the terminal blocks 17 and 18 provide wire terminals of sufficient size and structure to allow direct "field wiring" to the interface rack by electricians on the job site.

Referring particularly to FIGS. 1–3, the I/O interface rack mounts up to sixteen separate I/O modules 25 and one adapter module 26. The adapter module 26 is disposed along the right hand side plate 2, and although it is rather slender when viewed from the front, it extends over the entire vertical extent of the cavity 12. The adapter module 26 fastens to the upper and lower module mounting bars 13 and 15 by means of screws 27 and it electrically connects to the circuit board 11 by means of an edge connector (not shown in the drawings). As described in the above cited copending patent application entitled "Programmable Controller with Integral Micro-Processor", the adapter module 26 provides decoding and fault monitoring functions for the entire I/O interface rack. It couples to the controller processor and an adjacent I/O interface rack through cables which connect to respective connectors 28 and 29. Data flows through one of the connectors 28 and 29, through the adapter module circuitry and into the conductive paths on the circuit board 11. The adapter module circuitry also enables I/O modules to respond to data or transmit data by signals conveyed thereto through conductive paths on the circuit board 11. In other words, all data conveyed between the I/O modules 25 and the controller processor (not shown in the drawings) flows through the circuit board 11.

Each I/O module 25 is electrically connected to the circuit board 11 by an edge connector 30 which is disposed on the front surface of the circuit board 11 and within the cavity 12. The edge connectors 30 are commercially available connectors such as the twin leaf solder type mother board printer circuit connector, manufactured by AMP, Inc. which includes terminal pins (not shown) that extend through openings in the circuit board 11 and solder to respective conductive paths on its back surface. Eight of the connectors 30 are spaced apart equally across the width of the I/O interface rack above the module mounting bar 14 and the remaining eight connectors 30 are similarly spaced beneath the module mounting bar 14.

As shown best in FIG. 3, each I/O module 25 includes a circuit board 31 which presents, or directs, an edge 32 toward its rear. The module 25 is mounted by inserting this edge 32 in the appropriate edge connector 30 and by securely fastening the module 25 to the adjacent module mounting bars 13 and 14 or 14 and 15. Referring particularly to FIGS. 2 and 5a–5c, the circuit board 31 in each module 25 is substantially enclosed by a molded plastic case 33. The case is generally rectangular in shape and includes a relatively flat, rectangular front surface 34. The case 33 also includes a pair of oppositely directed support walls 35 and 36 and a pair of feet 43 and 44 which extend from its back to engage the mother board 11 when the module 25 is installed. The feet 43 and 44 engage the ends of the connector 30 and serve to guide the module 25 into an accurate connection therewith. The support wall 35 is directed upward when the I/O module 25 is mounted in place and a pair of spaced mounting tabs 37a and 37b extend upward therefrom. The mounting tabs 37a and 37b are integrally molded with the upper wall 35 and they rotatably retain and align a mounting screw 38. A similar set of mounting tabs 39a and 39b extend from the lower mounting wall 36 and they likewise support and retain a mounting screw 40. The mounting screws 38 and 40 are received in threaded openings 41 formed in the module mounting bars 13, 14 and 15, and when fastened thereto the tabs 37a and 39a are drawn tightly against the front surfaces of the mounting bars. The modules 25 are thus tightly retained in place with the conductive paths on their circuit boards 31 in electrical connection with the conductive paths on the mother board 11.

Figure 6:
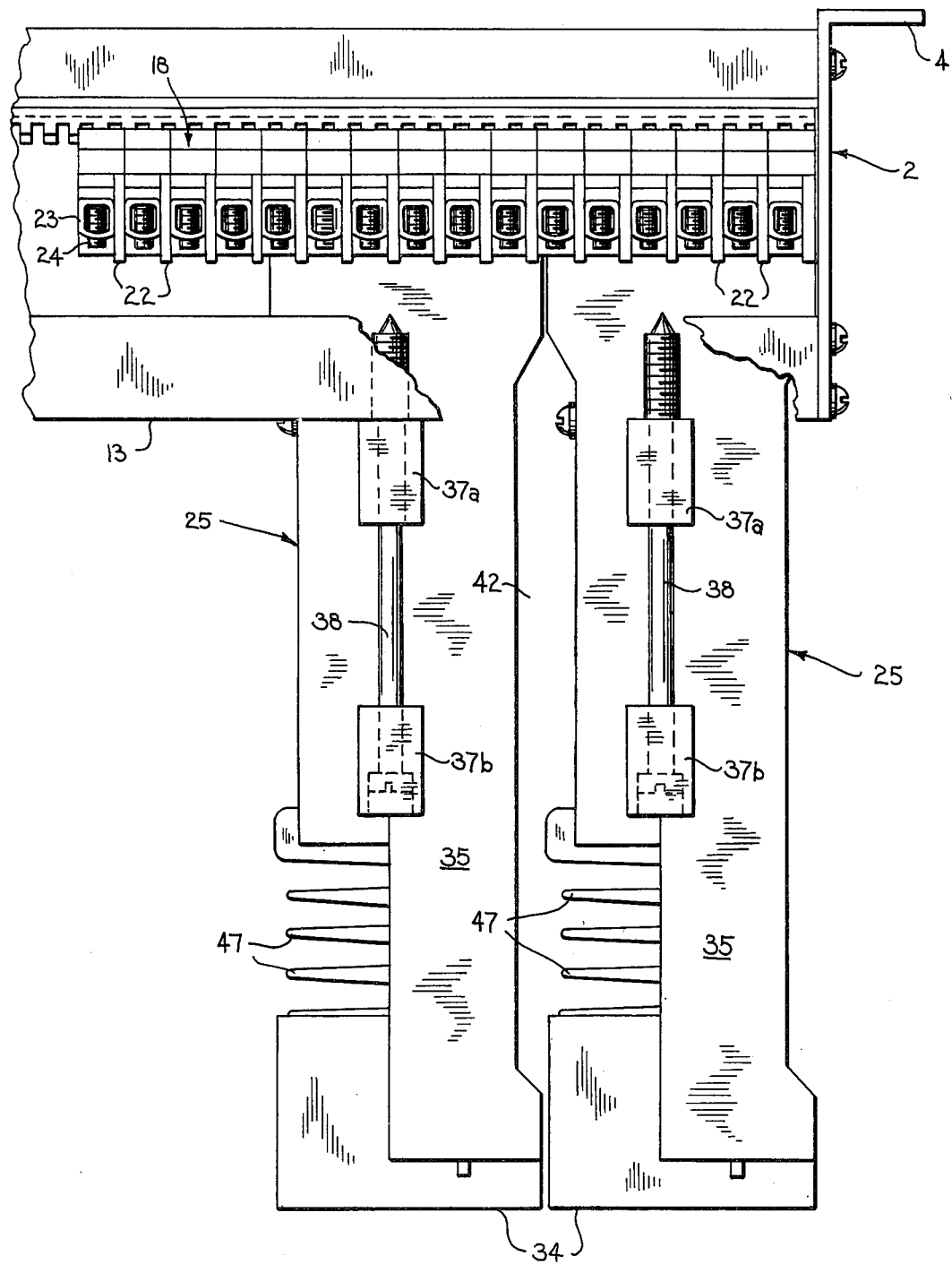
FIG. 6 is a partial top view of the invented interface rack.

Although spacing is provided between adjacent I/O modules 25 to allow for their easy removal and insertion, they are spaced closely enough to limit the lateral extent to which each module can be moved. As a result, adjacent modules 25 serve as a guideway when inserting an I/O module 25 and the modules 25 provide support for one another against lateral forces. As shown best in FIGS. 5b and 6, the middle portion of each module 25 is slightly narrower in width than its rear and forward ends. When the modules 25 are mounted adjacent to one another, therefore, substantial passageways 42 are formed therebetween which allow the unobstructed flow of cooling air. The I/O modules 25 are aligned one above the other in the I/O interface rack and these passageways 42 extend vertically through the entire interface rack to cool the electrical components therein. Also, many of the modules 25 include heat sinks 47 which communicate with the passageways 42 and which help to establish an upward flow of air therethrough.

An interface rack has been described which offers a number of advantages over prior structures. Individual modules can be inserted to removed without disconnecting any wires or disassembling any parts. The two mounting screws 38 and 40 are retained to the case 33 and although they must be rotated to remove or mount the module, they will not fall free or into a live electrical circuit. It is possible, therefore, to remove or replace I/O modules without powering down the entire programmable controller system. Also, the field wiring which is required to connect the I/O interface rack with the machine to be controlled is made directly to the terminal blocks 17 and 18. This is in sharp contrast to prior systems in which separate terminal blocks are provided in the cabinet which houses the interface rack and wires must be run between these terminals and the individual I/O module terminals.

We claim:

1. An I/O interface rack for coupling a control system processor to a set of wires connected to a controlled machine, the combination comprising:
   a pair of side plates disposed in spaced apart, substantially parallel relationship to one another;
   a mother board connected to each of said side plates and disposed therebetween, said mother board supporting first and second sets of electrically conductive paths disposed on its surface;
   a module mounting bar connected to each of said side plates and disposed therebetween to one side of said mother board;
   a plurality of edge connectors mounted to said mother board and disposed on said one side thereof, said edge connectors being spaced apart along the length of said module mounting bar, and each making electrical connection with said first and second sets of conductive paths on said mother board;
   a plurality of I/O modules, each of which is received by one of said edge connectors to make electrical connection with said control system processor through said first set of conductive paths and to make electrical connection with said second set of conductive paths and each is fastened to said module mounting bar; and
   a terminal block mounted along one edge of the mother board and disposed on said one side thereof, said terminal block including a plurality of wire terminals which are electrically connected to the I/O modules solely through said second set of conductive paths on said mother board and which are suitable for manual connection to said wires.

2. The I/O interface rack as recited in claim 1 wherein said I/O modules are disposed one along side the other and each includes a narrowed portion which defines a vertically directed air passageway with an adjacent I/O module.

3. The I/O interface rack as recited in claim 1 wherein said I/O modules are disposed one along side the other beneath said module mounting bar and each is fastened to said module mounting bar by a mounting screw which is rotatably retained to said I/O module and is received in a threaded opening in said module mounting bar.

4. The I/O interface rack as recited in claim 3 which includes a second module mounting bar that connects to each of said side plates and extends beneath said I/O modules, and each of said I/O modules includes a second mounting screw which is rotatably retained thereto and received in a threaded opening in said second mounting bar.

5. The I/O interface rack as recited in claim 4 which includes a second set of I/O modules disposed beneath said second module mounting bar one alongside the other, each I/O module in said second set being fastened in said second module mounting bar by a mounting screw and each being disposed directly beneath one of said I/O modules which is mounted above said second module mounting bar.

6. The I/O interface rack as recited in claim 5 which includes a second terminal block mounted along another edge of the mother board and disposed on said one side thereof, said second terminal block including a plurality of wire terminals which are electrically connected to the second set of conductive paths on said mother board and which are suitable for manual connection to said wires.

7. The I/O interface rack as recited in claim 5 in which a third module mounting bar connects to each of said side plates and extends therebetween beneath said second set of I/O modules and each I/O module in said second set is fastened to said third module mounting bar by a mounting screw.

8. The I/O interface rack as recited in claim 7 in which each I/O module includes a narrowed portion which defines a vertically directed air passageway with an adjacent I/O module, and the air passageways between I/O modules mounted above said second module mounting bar are aligned with air passageways between I/O modules mounted below said second module mounting bar to define a plurality of air passageways which extend through the entire vertical extent of the I/O interface rack.

9. An I/O interface rack for coupling a digital control system processor to a set of wires connected to a controlled machine, the combination comprising:
   a pair of side plates disposed in spaced apart relationship to one another;
   a set of mounting bars which connect to and extend between said side plates and which are disposed in a common back plane and in spaced apart relationship to one another;
   a mother board fastened to said mounting bars and disposed in said common back plane and between said side plates, said mother board supporting a first network of conductive paths, which can electrically connect to said digital control system processor, and a second network of conductive paths;
   a plurality of edge connectors mounted to said mother board and disposed on said one side thereof, said edge connectors being spaced apart along the length of said mother board, and each making electrical connection with said first and second networks of conductive paths on said mother board;

a plurality of I/O modules received by said edge connectors and mounted to make electrical connection with said first and second networks of conductive paths, said I/O modules being disposed to one side of said mother board and between said side plates;

and a terminal block mounted along one edge of said mother board and extending between said side plates, said terminal block having a plurality of wire terminals which are electrically connected to the I/O modules solely through said second network of conductive paths and which are each suitable for electrically connecting to and fastening with one of said wires.

10. The I/O interface rack as recited in claim 9 in which said terminal block is releasably retained to a mounting channel which is fastened to said mother board.

11. The I/O interface rack as recited in claim 9 in which said terminal block includes a molded plastic frame which includes a plurality of spaced upright barrier walls that define terminal compartments therebetween, and in which one of said wire terminals is disposed in each of said terminal compartments.

12. The I/O interface rack as recited in claim 11 in which each wire terminal includes means for releasably fastening a wire and an integral arm which extends from the terminal block into said mother board to make said electrical connection with the first network of conductive paths thereon.

13. The I/O interface rack as recited in claim 12 in which said terminal block is releasably retained to a mounting channel which is fastened to said mother board.

* * * * *